(12) United States Patent
Lucovsky et al.

(10) Patent No.: US 7,507,629 B2
(45) Date of Patent: Mar. 24, 2009

(54) SEMICONDUCTOR DEVICES HAVING AN INTERFACIAL DIELECTRIC LAYER AND RELATED METHODS

(76) Inventors: Gerald Lucovsky, 124 Lockwood West Dr., Cary, NC (US) 27511-9744; Christopher L. Hinkle, 4944 Summit Arbor Dr., Apt. 303, Raleigh, NC (US) 27606

( * ) Notice: Subject to any disclaimer, the term of this patent is extended or adjusted under 35 U.S.C. 154(b) by 294 days.

(21) Appl. No.: 10/938,110

(22) Filed: Sep. 10, 2004

(65) Prior Publication Data

US 2006/0054937 A1    Mar. 16, 2006

(51) Int. Cl.
*H01L 21/336* (2006.01)
(52) U.S. Cl. .................. 438/261; 438/604; 438/785; 257/324; 257/410; 257/411; 257/E21.65; 257/E21.639
(58) Field of Classification Search ................ 438/177, 438/261, 604, 785; 257/E21.65, E21.639, 257/324, 410, 411, E21.28, E21.289, E21.29, 257/E21.063
See application file for complete search history.

(56) References Cited

U.S. PATENT DOCUMENTS

| | | | |
|---|---|---|---|
| 4,804,640 A | 2/1989 | Kaganowicz et al. | |
| 5,763,922 A | 6/1998 | Chau | |
| 5,891,809 A | 4/1999 | Chau et al. | |
| 6,048,769 A | 4/2000 | Chau | |
| 6,087,236 A | 7/2000 | Chau et al. | |
| 6,407,435 B1 * | 6/2002 | Ma et al. | 257/411 |
| 6,538,278 B1 | 3/2003 | Chau | |
| 6,563,183 B1 | 5/2003 | En et al. | |
| 6,597,046 B1 | 7/2003 | Chau et al. | |
| 6,610,615 B1 | 8/2003 | McFadden et al. | 438/776 |
| 6,617,209 B1 | 9/2003 | Chau et al. | 438/240 |
| 6,617,210 B1 | 9/2003 | Chau et al. | |

(Continued)

FOREIGN PATENT DOCUMENTS

JP    2002 060944 A    2/2002

(Continued)

OTHER PUBLICATIONS

Jung et al., "Improved Current Performance of CMOSFET's with Nitrogen Incorporated $HfO_2$-$Al_2O_3$ Laminate Gate Dielectric," IEEE, 2002.

(Continued)

*Primary Examiner*—Long K Tran
(74) *Attorney, Agent, or Firm*—Myers Bigel Sibley & Sajovec (57) ABSTRACT

A semiconductor device includes a semiconductor substrate including silicon and an oxide layer on the substrate. The oxide layer includes silicon. An interfacial dielectric layer is disposed on the oxide layer opposite the substrate. The interfacial dielectric layer includes $HfO_2$, $ZrO_2$, a zirconium silicate alloy, and/or a hafnium silicate alloy having a thickness between about 0.5 nm and 1.0 nm. A primary dielectric layer is disposed on the interfacial dielectric layer opposite the substrate. The primary dielectric layer includes $AlO_3$; $TiO_2$; a group IIIB or VB transition metal oxide; a trivalent lanthanide series rare earth oxide; a silicate alloy; an aluminate alloy; a complex binary oxide having two transition metal oxides and/or a complex binary oxide having a transition metal oxide and a lanthanide rare earth oxide. A thickness of the primary dielectric layer is at least about five times greater than the thickness of the interfacial dielectric layer.

17 Claims, 6 Drawing Sheets

U.S. PATENT DOCUMENTS

| | | | |
|---|---|---|---|
| 6,620,713 | B2 | 9/2003 | Arghavani et al. |
| 6,667,232 | B2 | 12/2003 | Keating et al. |
| 6,667,251 | B2 | 12/2003 | McFadden et al. |
| 6,682,973 | B1 * | 1/2004 | Paton et al. ............... 438/240 |
| 6,696,327 | B1 | 2/2004 | Brask et al. |
| 6,706,581 | B1 | 3/2004 | Hou et al. |
| 6,713,358 | B1 | 3/2004 | Chau et al. |
| 6,787,440 | B2 | 9/2004 | Parker et al. |
| 6,809,017 | B2 | 10/2004 | Arghavani et al. |
| 6,864,145 | B2 | 3/2005 | Hareland et al. |
| 6,887,800 | B1 | 5/2005 | Metz et al. |
| 6,897,134 | B2 | 5/2005 | Brask et al. |
| 6,900,481 | B2 * | 5/2005 | Jin et al. ............... 257/249 |
| 6,939,815 | B2 | 9/2005 | Brask et al. |
| 2002/0089023 | A1 * | 7/2002 | Yu et al. ............... 257/411 |
| 2002/0153579 | A1 | 10/2002 | Yamamoto |
| 2003/0216059 | A1 | 11/2003 | McFadden et al. ....... 438/795 |
| 2004/0067660 | A1 | 4/2004 | Wilk et al. |
| 2004/0069990 | A1 * | 4/2004 | Mahajani et al. ............ 257/66 |
| 2005/0269651 | A1 * | 12/2005 | Chen et al. ............... 257/411 |
| 2005/0280006 | A1 * | 12/2005 | Tanida et al. ............... 257/78 |
| 2006/0035450 | A1 * | 2/2006 | Frank et al. ............... 438/585 |

OTHER PUBLICATIONS

Hou et al., "Quantum Tunneling and Scalability of HfO$_2$ and HfAlO Gate Stacks", IEEE, 2002.

Lee et al., "Mass Production Worthy of HfO$_2$-Al$_2$O$_3$ Laminate Capacitor Technology using Hf Liquid Precursor for Sub-100nm DRAMs," IEEE, 2002.

Niimi et al., "Monolayer-level controlled incorporation of nitrogen in ultrathin gate dielectrics using remote plasma processing: Formation of stacked "N-O-N" gate dielectrics", J. Vac. Sci. Technol. B17(6), Nov./Dec. 1999, pp. 2610-2621.

Chol et al. "Improved Charge-Trapping Nonvolatile Memory with Dy doped HfO$_2$ as Charge-Trapping Layer and Al$_2$O$_3$ as Blocking Layer" *Japanese Journal of Applied Physics* 43(7A):L882-L884 (2004).

European Search Report for EP 05 25 5294; date of mailing Oct. 5, 2006.

Gilmer et al. "Compatibility of polycrystalline silicon gate deposition with HfO$_2$ and Al$_2$O$_3$/HfO$_2$ Gate dielectrics" *Applied Physics Letters* 81(7):1288-1290 (2002).

Haartman et al. "Low-frequency noise in Si$_{0.7}$Ge$_{0.3}$ surface channel pMOSFETs with ALD HfO$_2$/Al$_2$O$_3$ gate dielectrics" *Solid-State Electronics* 48:2271-2275 (2004).

Kundu et al. "Effect of Al$_2$O$_3$ capping layer on suppression of interfacial SiO$_2$ growth in HfO$_2$/ultrathin SiO$_2$/Si(001)structure" *Applied Physics Letters* 82(20) 3442-3444 (2003).

Wilk et al. "High-$_k$ gate dielectrics: Current status and materials properties considerations" *Journal of Applied Physics* 89(10) 5243-5275 (2001).

Yang et al. "Dramatic reduction of gate leakage current in 1.61nm HfO$_2$ high-k dielectric poly-silicon gate with Al$_2$O$_3$ capping layer" *Electronics Letters* 38(20) 2 pages (2002).

Y.T. Hou, M.F. Li, D.L. Kwong, "Quantum Tunneling and Scalability of HfO2 and HfAlO Gate Stacks" in Tech Digest International Electron Device Meeting (IEDM, San Francisco, CA, pp. 731-734, 2002.

Hinkle et al. A Novel Approach for Determining the Effective tunneling Mass of Electrons in HfO$_2$ and Other High-*K* Alternative Gate Dielectrics for Advanced CMOS Devices.

Jung et al. "Improved Current Performance of CMOSFETs with Nitrogen Incorporated HfO2-Al2O3 Laminate Gate Dielectric" *IEEE Electron Devices Meeting, 2002. IEDM '02. Digest. International.*

Koyama et al. "Effects of Nitrogen in HfSiON Gate Dielectric on the Electrical Thermal Characteristics" *IEEE International Electron Devices Meeting* pp. 849-852 (2002).

Lee et al. "Mass Production Worthy HfO$_2$-Al$_2$O$_3$ Laminate Capacitor Technology using Hf Liquid Precursor for Sub-100nm DRAMs" IEDM Tech Dig. paper 3.1 (2002).

Nimi et al. "Monolayer-level Controlled incorporation of Nitrogen in Ultrathin Gate Dielectrics Using Remote Plasma Processing: Formation of Stacked "N-O-N" Gate Dielectrics" *J Vac Sci Technol* B 17(6): 2610-2621 (1999).

Ritala "Atomic Layer Deposition" Chapter 2.1, pp. 17-64, *High-K Gate Dielectrics* Michel Houssa, ed., Institute of Physics Publishing, Bristol and Philadelphia (2004).

* cited by examiner

SEMICONDUCTOR DEVICES HAVING AN INTERFACIAL DIELECTRIC LAYER AND RELATED METHODS

FIELD OF THE INVENTION

The invention generally relates to oxides that may be used in conjunction with integrated circuit devices, e.g., field effect transistors and high electron mobility transistors, as well as other devices including photovoltaics, and methods of making the same.

BACKGROUND OF THE INVENTION

Insulated gate field effect transistors (IGFETs) typically include a channel region in which current is controlled through the application of an electrical bias to a gate electrode that is separated from the channel region by a thin insulating film or gate dielectric. Current through the channel is supplied and collected by source and drain contacts, respectively. As semiconductor devices become increasingly miniaturized, gate dielectrics having a reduced equivalent oxide thickness (EOT) may be desirable. For example, the Semiconductor Industry Association (SIA) National Technology Roadmap for Semiconductors (NTRS) has projected that gate dielectrics with an EOT below 1 nm may be desirable for uses such as in advanced complementary metal-semiconductor oxide field effect transistor (CMOS FET) devices having channel lengths scaled to below 50 nm. However, reduced EOT dielectrics may exhibit relatively high levels of tunneling leakage current. For example, tunneling of conventional materials such as $SiO_2$ may exceed 1-5 $A/cm^2$ at applied gate bias levels of about 1 V above threshold for an EOT of less than 1.4 nm and be detrimental to device performance and/or reliability.

One possible approach for decreasing EOT without increasing tunneling leakage current may involve substituting alternative oxides with dielectric constants (K) that could exceed that of $SiO_2$. Silicon dioxide has a dielectric constant of approximately 3.9. For example, it may be desirable to obtain oxides with dielectric constants ranging from approximately 10 to more than 30. However, dielectric materials with higher vales of K generally tend to have relatively small band gaps of about 5 to 6 eV, as compared to about 9 eV for $SiO_2$, which can also contribute to undesirable high tunneling leakage current in semiconductor devices despite a relatively high dielectric constant.

Silicon nitride and silicon oxynitride alloys have been proposed as the first generation of alternative gate dielectric materials. Silicon nitride and silicon oxynitride alloys have dielectric constants of approximately 7.6 and 5.5 to 6.0 respectively. For example, C. J. Parker, G. Lucovsky and J. R. Hauser, *IEEE Electron. Device Lett.* (1998); Y. Wu and G. Lucovsky, *IEEE Electron. Device Lett.* (1998); and H. Yang and G. Lucovsky, *IEDM Digest,* (1999) propose oxide-nitride and oxide-oxynitride alloy stacked dielectrics with EOT projected to be greater than about 1.1 to 1.2 nm before tunneling leakage at approximately 1 V is increased above 1-5 $A/cm^2$. The preparation of these stacked dielectrics proposes two 300° C. remote plasma process steps: i) plasma-assisted oxidation to form Si—$SiO_2$ interface layers ranging in thickness from about 0.5 to 0.6 nm, and ii) remote plasma-enhanced chemical vapor deposition (RPECVD) to deposit either a nitride or an oxynitride (e.g., $(SiO_2)_x(Si_3N_4)_{1-x}$ with x~0.5) dielectric film in the dielectric stack. After deposition, a low thermal budget, e.g., 30 second, 900° C., rapid thermal anneal (RTA) has been proposed in an attempt to achieve chemical and structural relaxation. This RTA may promote optimized performance in IGFET devices [G. Lucovsky, A. Banerjee, B. Hinds, G. Claflin, K. Koh and H. Yang, *J. Vac. Sci. Technol.* B15, 1074 (1997)]. Stacked nitride and oxynitride gate dielectrics may display improved performance and reliability with respect to thermally-grown oxides of the same EOT. Nonetheless, these gate dielectrics typically have EOT of greater than 1.1 to 1.2 nm in order to attempt to maintain direct tunneling leakage below 1 $A/cm^2$. The nitride and oxynitride layers of these devices may be sufficiently thick to minimize or stop boron out-diffusion out of $p^+$ polycrystalline Si gate electrodes in the p-channel IGFETs [Y. Wu, et al., Vac. Sci. Technol. B17 1813 (1999)].

Other high-K dielectrics have been proposed (e.g., a K greater than 8) including $TiO_2$ [J. Yan, D. C. Gilmer, S. A. Campbell, W. L. Gladfelter and P. G. Schmid, *J. Vac. Sci. Technol.* B 14, 1706 (1996).], $Ta_2O_5$ [H. Shinrike and M. Nakata, *IEEE Trans. on Elec. Devices* 38, 544 (1991)], $Al_2O_3$ [L. Manchanda, W. H. Lee, J. E. Bower, F. H. Baumann, W. L. Brown, et al., *IEDM Tech. Dig.,* p. 605 (1998)], $ZrO_2$, [R. B. van Dover, et al., *IEEE Electron Device Lett.,* 19, 329, (1998)] and $Zr(Hf)O_2$—$SiO_2$ (also designated as Zr(Hf)-silicates; see van Dover et al.). These materials may not demonstrate the targeted goals of capacitance with decreased tunneling or leakage currents that may be desirable for silicon CMOS devices. For example, some of these materials, e.g., $TiO_2$ and $Ta_2O_5$ may exhibit tunneling or leakage currents in CMOS devices with EOT less than 1 nm that are greater than 1-5 $A/cm^2$. Using these and other dielectrics, the ultimate performance of the materials with EOTs extending to about 0.5 nm may be limited due to the oxidation of the silicon substrate that can occur during thermal chemical vapor deposition (CVD) or during post-deposition processing, such as, for example, thermal anneals, to fully oxidize the deposited thin films. This oxidation contributes to EOT, and in combination with the contribution of EOT of the high-k material makes it difficult to reduce the composite value of EOT to ~0.5 nm.

Another high-K dielectric is non-crystalline $Al_2O_3$. The dielectric constant of $Al_2O_3$ is generally about nine or less, but $Al_2O_3$ has a band gap of more than 7 eV and conduction and valence band offset energies greater than 2 eV. However, because of its increased bond-ionicity with respect to $SiO_2$ non-crystalline $Al_2O_3$ dielectric films may display a high value of interfacial fixed negative charge, e.g., greater than $10^{12}$ $cm^{-2}$, as compared to less than $10^{11}$ $cm^{-2}$ for $SiO_2$ dielectrics, at interfaces with Si, or at interfaces with superficially thin (<0.5-1.0 nm) non-crystalline $SiO_2$ in contact with Si (R. S. Johnson, et al, J. Vac. Sci. Technol. A 19, 1353 (12001)). This high value of fixed charge has been correlated with electron and hole mobility degradation in the channel of IGFET devices and can potentially contribute to a reduction in the dimensionally-scaled drive current by factors of two or more. Accordingly, the gains in device capacitance derived from the increased value of K may be diminished.

There may be other problems in the application of dielectric materials into aggressively scaled MOSFET devices. The various problems that can be experienced include i) high values of interfacial fixed charge that are generally positive ii) ion and atom transport, iii) high reactivity with ambient gases, giving rise to incorporation or water or hydroxyl groups, and iv) lower than anticipated tunneling currents due to reduced electron masses associated with the electronic structure, e.g., because the lowest conduction band has d-state properties. This last effect may be more apparent in transition metal oxides than in rare earth oxides. Other process integration issues may relate to the combined effects of their hydrophyllic nature and oxygen ion transport that can promote changes in interface bonding during post-deposition thermal process steps, including dopant activation of atoms in source and drain contacts to the channel in a MOSFET device.

Other high-K dielectric materials include non-crystalline silicate and aluminate alloys, which are generally non-stoichiometric and may not correspond to the composition of a particular crystalline phase. For example, hafnium silicate and aluminate alloys in the alloy composition range from ~25% to at most 50% $HfO_2$ have been proposed, as well as Zr silicate and aluminate alloys. Hafnium silicates may have reduced reactivity with Si substrates and the like. However, one drawback for both group IVB silicates may be their thermal stability against chemical phase separation into $ZrO_2$ or $HfO_2$, and a relatively low content silicate alloy (less than 10% $ZrO_2$ or $HfO_2$ as determined by the concentration of the eutectic in the equilibrium phase diagram), and crystallization of the $ZrO_2$ or $HfO_2$ phase. Thermal instability generally occurs at temperatures of ~900° C. for low $ZrO_2$ content Zr silicate alloys, and at temperature ~1000° C. for low $HfO_2$ content Hf silicates. Less is understood about chemical phase separation in aluminate alloys; however, there is some evidence for crystallization in Hf aluminate alloys. Decreases in K upon alloying with either $SiO_2$ or $Al_2O_3$ may be significant. For example, the Zr and Hf silicate alloys that display the greatest amount of thermal stability against crystallization have dielectric constants less than 15 Nonetheless, they display reduced direct tunneling with respect to their respective end-member elemental oxides because of mitigating factors, such as the tunneling effective mass, that decreases as the transition metal oxide fraction increases. The precursor bonding states that drive the chemical phase separation can be a function of the degree of rigidity or over-constrained bonding in the non-crystalline alloy, particularly in the composition range of about 25 to 50% $ZrO_2$ or $HfO_2$. The increased rigidity of these alloys relative to non-crystalline $SiO_2$, and nano- or micro-crystalline $ZrO_2$ or $HfO_2$, is the driving force for the chemical separation. The separated state is lower in energy, but also has a significantly reduced dielectric constant that renders phase separated dielectrics not useful for certain applications. In addition, the rigidity of these low $ZrO_2$/$HfO_2$ content silicate films may result in i) defects in the bulk of the film that cannot be compensated by hydrogen or deuterium, and leads to electron injection and trapping under biased conditions, and also ii) defect formation at the semiconductor dielectric interfaces, e.g., silicon atom dangling bonds in the strained silicon in contact with the dielectric film, and/or a superficially thin region with predominantly Si suboxide or Si—O bonding.

Other potential problems encountered with various high-K dielectrics may relate to: (1) the crystallization of the deposited films during either deposition or post-deposition processing, (2) the low dielectric constants of the bulk films that may be insufficient to meet the targeted goals, and (3) the formation of interfacial silicon oxides, or low content silicon oxide alloys (e.g., silicates) that may limit the attainable effective values of the K for the resulting stacked dielectric structure. For example, it is believed that oxidation of the silicon substrate during deposition or post-deposition processing may mitigate many of the gains of high-K layers with respect to achievable capacitance, whereas crystallization has the potential to open up alternative conduction pathways, the possibility of anisotropic dielectric constant behavior, and the potential to produce surface roughening.

The formation of interfacial silicide bonds may result in undesirable interfacial defects. Such defects may occur in the form of fixed positive charge or interface traps. Thus, it may be desirable to employ a thin dielectric interface layer of $SiO_2$ between the dielectric layer and the silicon substrate. Utilizing such interfacial layers with known insulating film dielectrics, however, may be disadvantageous in that they may limit the dielectric stacks from having sufficient capacitance to meet the ever-increasing scaling demands of CMOS devices. Additionally, this use of interfacial layers may also limit the incorporation of high-K oxides into devices that employ semiconductor substrates other than silicon such as, for example, silicon carbide, gallium nitride (SiC and GaN, respectively) and compound semiconductors such as, (Al,Ga)N, GaAs, (Al,Ga)As, (In,Ga)As, GaSb, (Al,Ga)Sb, (In,Ga)Sb, as well as nitride, arsenide and antimonide quaternary III-V alloys.

SUMMARY

The present invention, according to a number of embodiments, seeks to address at least some of the problems above thereby providing an advantage. For example, embodiments of the present invention may provide a reduction in interfacial defects. According to embodiments of the present invention, a semiconductor device includes a semiconductor substrate including silicon and an oxide layer on the substrate. The oxide layer includes silicon. An interfacial dielectric layer is on the oxide layer opposite the substrate. The interfacial dielectric layer includes $HfO_2$, $ZrO_2$, a zirconium silicate alloy, and/or a hafnium silicate alloy and has a thickness of between about 0.5 nm and 1.0 nm. A primary dielectric layer is on the interfacial dielectric layer opposite the substrate. The primary dielectric layer includes $Al_2O_3$; $TiO_2$; a group IIIB or VB transition metal oxide; a trivalent lanthanide series rare earth oxide; a silicate alloy; an aluminate alloy; a complex binary oxide having two transition metal oxides and/or a complex binary oxide having a transition metal oxide and a lanthanide rare earth oxide. A thickness of the primary dielectric layer is at least about five times greater than the thickness of the interfacial dielectric layer.

According to further embodiments of the present invention, a semiconductor device includes a semiconductor substrate including a group III-IV or group III-V compound. An oxide layer is on the substrate. The oxide layer includes a group III element from the substrate. An interfacial dielectric layer is on the oxide layer opposite the substrate and includes $HfO_2$, $ZrO_2$, a zirconium silicate alloy, and/or a hafnium silicate alloy. The interfacial layer has a thickness of between about 0.5 nm and 1.0 nm. A primary dielectric layer is on the interfacial dielectric layer opposite the substrate. The primary dielectric layer includes silicon or a silicon oxynitride alloy. A thickness of the primary dielectric layer is at least about five times greater than the thickness of the interfacial dielectric layer.

In some embodiments according to the invention, a semiconductor device includes a semiconductor substrate including silicon. An oxide layer is on the substrate and the oxide layer includes silicon. An interfacial dielectric layer is on the oxide layer opposite the substrate. The interfacial dielectric layer includes $HfO_2$ and has a thickness of between about 0.5 nm and 1.0 nm. A primary dielectric layer is on the interfacial dielectric layer opposite the substrate. The primary dielectric layer includes $AlO_3$. A thickness of the primary dielectric layer is at least about five times greater than the thickness of the interfacial dielectric layer.

Devices according to embodiments of the present invention may include a field effect transistor, a photovoltaic device, a high electron mobility transistor, and the like, for example. Methods of forming semiconductor devices are provided according to embodiments of the present invention.

DETAILED DESCRIPTION OF EMBODIMENTS OF THE INVENTION

The present invention now will be described more fully hereinafter with reference to the accompanying drawings and examples, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention. Moreover, terms such as "horizontal", "vertical" and "perpendicular" indicate general directions or relationships rather than precise 0° or 90° orientations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
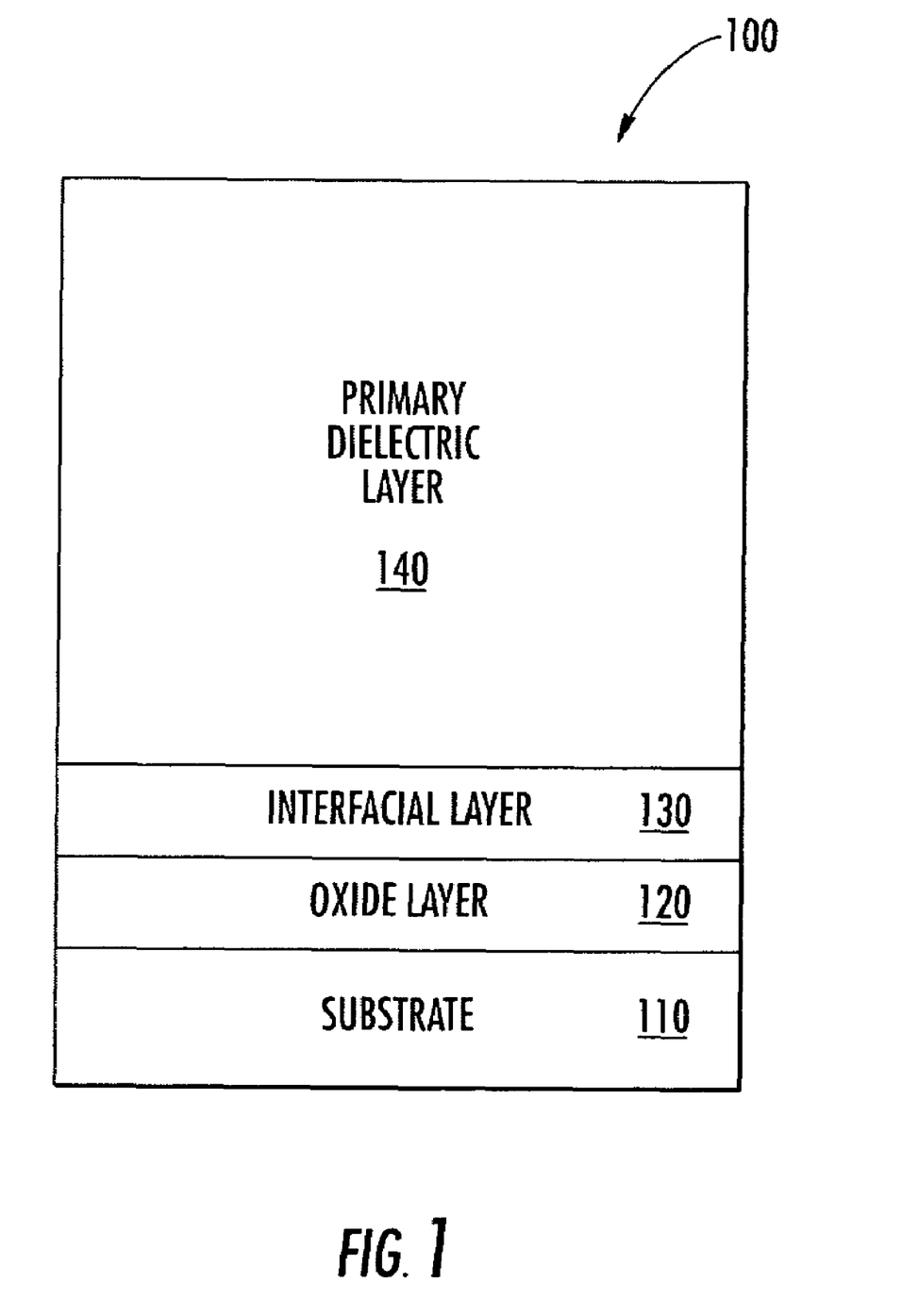
FIG. 1 is a cross sectional side view of a device according to embodiments of the present invention.

As illustrated in FIG. 1, a semiconductor device 100 includes a substrate 110, an oxide layer 120 on the substrate 110, an interfacial layer 130, and a primary dielectric layer 140. The interfacial layer 130 has a thickness of between about 0.5 nm and 1.0 nm. The primary dielectric layer 140 has a thickness of at least about about five times the thickness of the interfacial layer 130. Without wishing to be bound by theory, in this configuration, the interfacial layer 130 may reduce at least some defects between the oxide layer 120 and/or the substrate 110 and the primary dielectric layer 140 and fixed charges at the interface between layers may be reduced to some degree. Accordingly, various high dielectric materials may be used as the primary dielectric layer 140 with relatively reduced interfacial fixed charges and/or relatively reduced defects.

For example, the semiconductor substrate 110 can include silicon and the oxide layer 120 can be a silicon oxide layer.

Examples of suitable substrate materials that include silicon are silicon, silicon carbide, silicon-germanium alloys, and the like. The interfacial layer 130 can include $HfO_2$, $ZrO_2$, a zirconium silicate alloy, a hafnium silicate alloy, and the like. The primary dielectric layer 140 on the interfacial layer 130 can include $AlO_3$; $TiO_2$; a group IIIB or VB transition metal oxide, such as $Sc_2O_3$ or $Ta_2O_5$, respectively; a trivalent lanthanide series rare earth oxide, such as $Gd_2O_3$; a silicate alloy, such as $(Gd_2O_3)_x(SiO_2)_{1-x}$; an aluminate alloy, such as $(Gd_2O_3)_x(Al_2O_3)_{1-x}$; a complex binary oxide having two transition metal oxides and/or a complex binary oxide having a transition metal oxide, such as $(ZrO_2)_x(TiO_2)_{1-x}$, and a lanthanide rare earth oxide, such as $(Dy_2O_3)_x(Sc_2O_3)_{1-x}$.

As another example, the substrate 110 can include a group III-IV or group III-V compound. The oxide layer 120 can include a group III element from the substrate. The interfacial layer 130 on the oxide layer opposite the substrate can include $HfO_2$, $ZrO_2$, a zirconium silicate alloy, and/or a hafnium silicate alloy. The primary dielectric layer 140 on the interfacial dielectric layer opposite the substrate can include silicon or a silicon oxynitride alloy, such as GaN—GaO—$ZrO_2$—$SiO_2$, and the like.

In this configuration, the density of defects between the substrate 110 and the primary dielectric layer 140 can be reduced to some degree by the oxide layer 120 in combination with the interfacial layer 130. In some embodiments, the defect density between the oxide layer 120 and interfacial layer 130 is about $10^{11}$ defects/cm$^2$ or less. In some embodiments, the defect density between the interfacial layer 130 and primary dielectric layer 140 is about $10^{11}$ defects/cm$^2$ or less. The interfacial layer 130 and the primary dielectric layer 140 may have approximately the same number of average bonds per atom at an interface between the layers. Fixed charges at the interface between layers may also be reduced, for example, from the $10^{12}$ cm$^{-2}$ level to the $10^{11}$ cm$^{-2}$ level or less. High dielectric constants can be used as the primary dielectric layer 140 with reduced defect densities. For example, $AlO_3$, $TiO_2$, group IIIB or VB transition metal oxides, trivalent lanthanide series rare earth oxides, silicate alloys, aluminate alloys, complex binary oxides having two transition metal oxides, complex binary oxides having a transition metal oxide, lanthanide rare earth oxides, silicon, and/or silicon oxynitride alloys, and the like can be used as the primary dielectric layer 140. In some embodiments, the interfacial layer 130 is thermally annealed to reduce defects.

In some embodiments, the interfacial layer 130 does not significantly contribute to the equivalent oxide thickness (EOT) of the layers 130 and 140. For example, the interfacial layer 130 can have an EOT that is less than 0.2 nm. The primary dielectric layer 140 can contribute significantly more EOT to the configuration illustrated in FIG. 1. For example, the primary dielectric layer can have an EOT of greater than 0.5 nm or between about 0.5 and 1.5 nm. The oxide layer 120 can include nitrogen and/or haves a physical thickness of less than about 0.40 nm.

Figure 2:
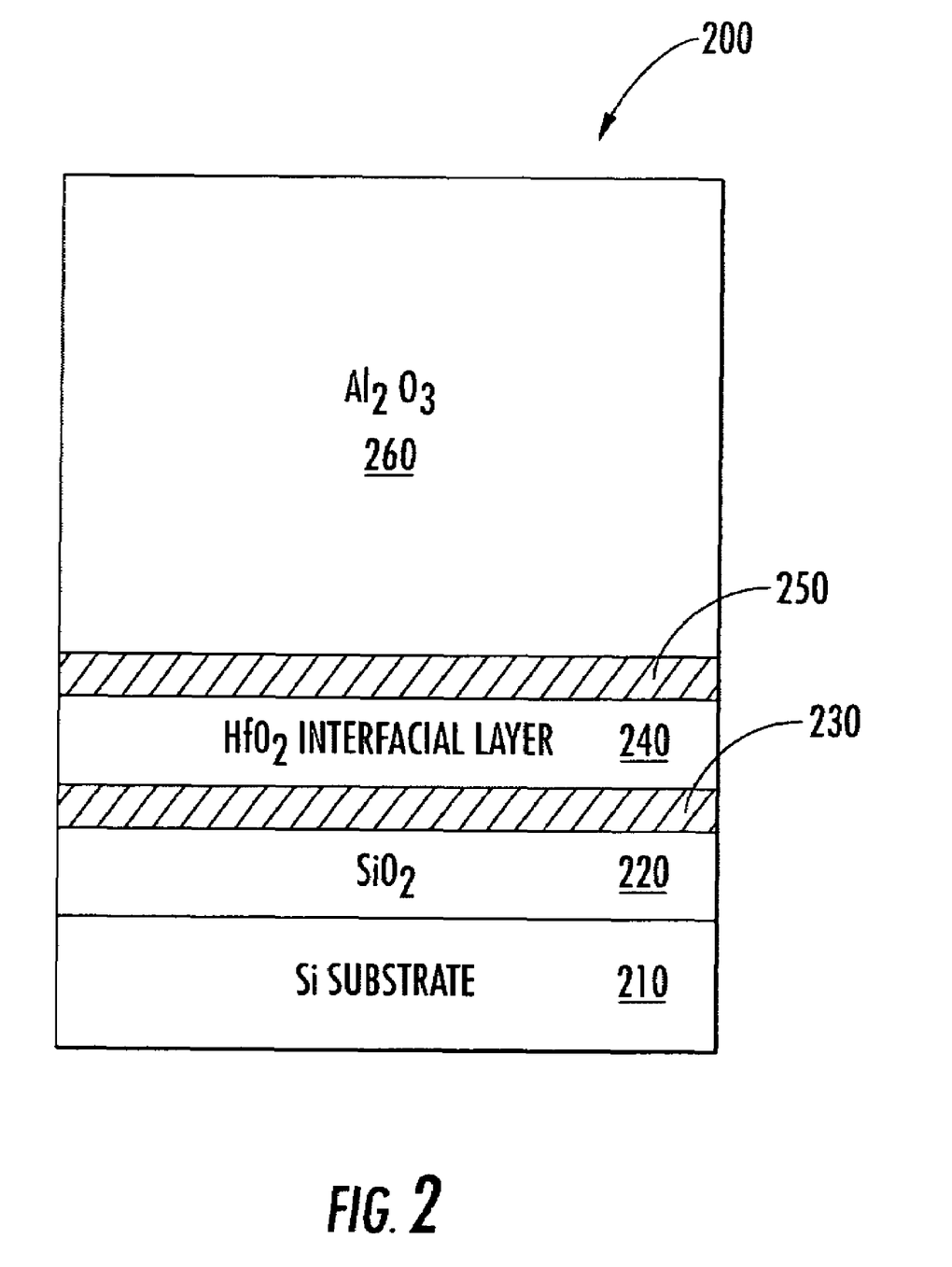
FIG. 2 is a cross sectional side view of a device having a silicon substrate according to embodiments of the present invention.

In particular embodiments shown in FIG. 2, a semiconductor device 200 includes a silicon substrate 210, a silicon dioxide layer 220, a transition region 230, a hafnium dioxide interfacial layer 240, another transition region 250, and an aluminum oxide primary dielectric layer 260. In some embodiments, the defect density at the transition regions 230 and 250 is about $10^{11}$ defects/cm$^2$.

Figure 3:
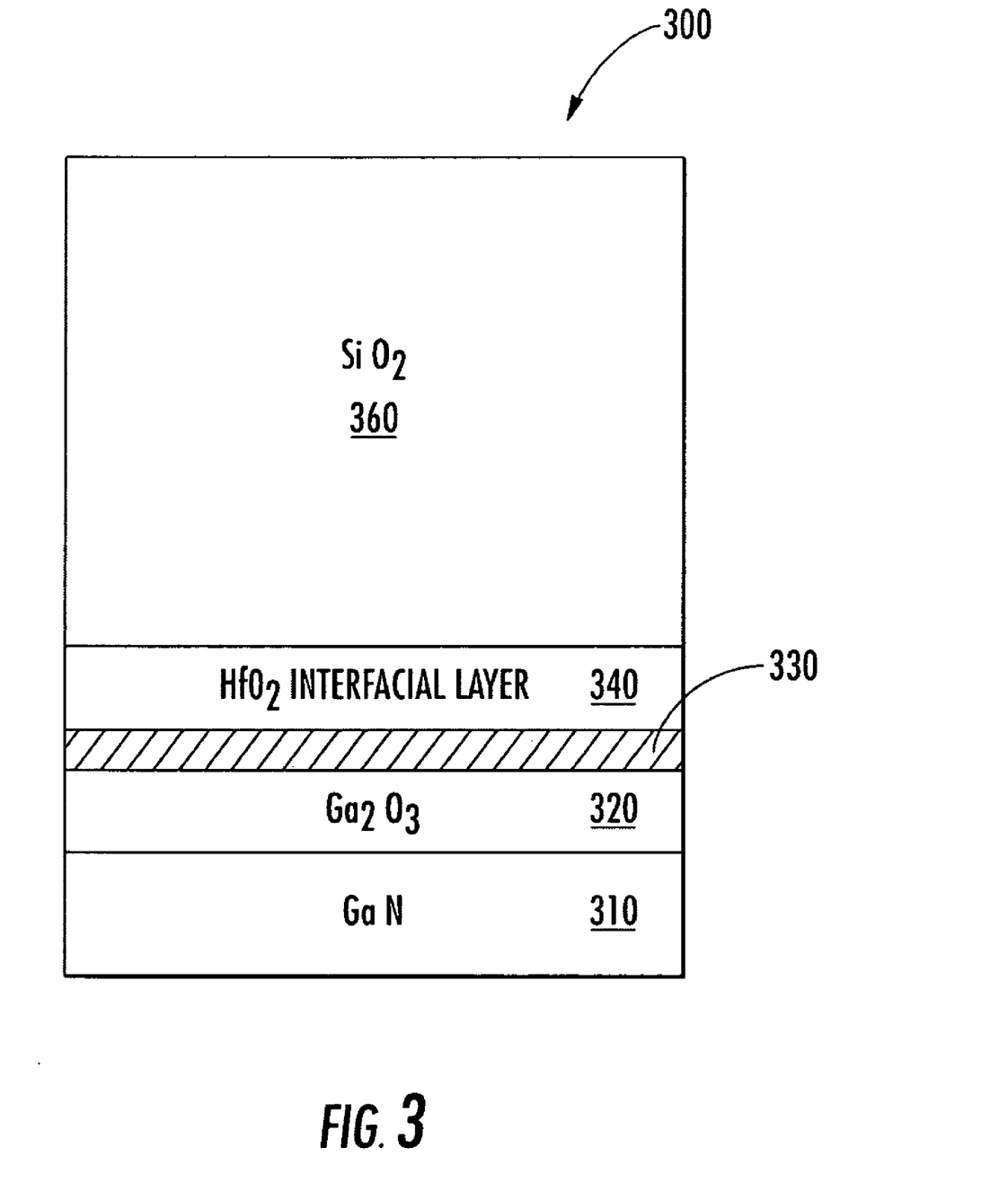
FIG. 3 is a cross sectional side view of a device having a gallium nitride substrate according to embodiments of the present invention.

In particular embodiments shown in FIG. 3, a semiconductor device 300 includes a gallium nitride substrate 310, a gallium oxide layer 320, a transition region 330, a hafnium dioxide interfacial layer 340, a transition region 350, and a silicon dioxide primary dielectric layer 360. In some embodiments, the defect density at the transition regions 330 and 350 is about $10^{11}$ defects/cm$^2$.

According to embodiments of the present invention, dielectric layers in the configurations shown in FIG. 1-3 are provided as passivation or active layers in various electronic, photoelectronic, and/or microelectronic devices. For example, dielectric layers including an interfacial layer as illustrated in FIGS. 1-3 may be used as gate dielectrics that are a constituent of microelectronic devices such as insulating gate field effect transistors (IGFETs) or the like, that include crystalline, polycrystalline, and amorphous (non-crystalline) semiconductors. In still further embodiments according to the present invention, thin film surface passivation layer dielectric materials are provided for other devices including but not limited to photovoltaic devices, such as radiation detectors and solar energy converters, and buried channel field effect transistors, such as HEMTs. Dielectric layers including interfacial layers according to embodiments of the present invention may be generally less than 15 nm thick, and may be non-crystalline. As used herein, "non-crystalline" and "amorphous" are used interchangeably to refer to substances in which the atoms do not generally exhibit crystallinity on any size scale, for example, as determined by conventional x-ray, electron or neutron diffraction, and electron imaging techniques, including, but not limited to high resolution transmission electron micrographs, in either the bright or dark field measurement configurations, or alternatively, and in both bright and dark field images of the same portion of the dielectric film.

In some embodiments according to the present invention, dielectric layers having an interfacial dielectric layer as shown in FIGS. 1-3 may be employed in field effect transistors as thin gate insulating layers having high dielectric constants. The dielectric layers illustrated in FIGS. 1-3 potentially allow for field effect transistors employing the same to possess gate capacitance in excess of what may be achieved with conventional insulating layers and with reduced direct tunneling currents. As an example, the direct tunneling currents may be reduced by one order of magnitude, two to three orders of magnitude, or more, such as from levels in excess of 1 A/cm$^2$ for an EOT of approximately 0.5 to 1.6 nm.

Primary dielectric layers and interfacial dielectric layers such as is shown in FIGS. 1-3 may be provided with band gaps ($E_g$) of about 5 eV, and conduction band offset energies of about 2 to 3.5 eV. Stacked dielectric materials as described in FIGS. 1-3 may be used in i) metal-oxide semiconductor field-effect transistors (MOSFETs) or Si IGFETs, as well as ii) thin film transistors (TFTs), which include IGFETs or the like in which all of the constituent layers are formed by thin film deposition techniques, for instance. Gate dielectrics as described with respect to the devices shown in FIGS. 1-3 for silicon MOSFETs may have significantly higher dielectric constant (K) than non-crystalline (or, equivalently, amorphous) $SiO_2$ (K=3.9) to enable the gate dielectric to reach an electrical equivalent of an $SiO_2$ layer, generally designated as the equivalent oxide thickness or EOT, with a physical thickness, $t_{ox}$, of less than about 10 Å with a substantially thicker film in which the physical thickness is increased by the dielectric constant ratio. Moreover, gate dielectrics including an interfacial layer may be provided having a band gap of between about 5.5 and 8 eV, and band offset energies with respect to the conduction and valence bands of Si, $\Delta E_c$ and $\Delta E_v$, respectively, at least about 1.5 eV or more in order to provide sufficiently low gate leakage.

The stacked dielectric layers described with respect to FIGS. 1-3 may be used in field effect transistors, including insulating gate field effect transistors (IGFETs), metal-oxide-semiconductor field effect transistors (MOSFETs), thin film transistors (TFTs), and the like. For example, the gate insulating layers of such devices can include stacked dielectric layers described with respect to FIGS. 1-3.

A number of techniques can be used in forming thin film oxides. Exemplary techniques include, but are not limited to, a laser-assisted chemical vapor deposition, a direct or remote plasma assisted chemical vapor deposition, an electron cyclotron resonance chemical vapor deposition, a reactive physical vapor deposition and an atomic layer deposition. For example, a remote plasma assisted chemical deposition (REPCVD) can be employed. Various reactive physical vapor depositions can be used such as, for example, a thermal evaporation, an electron beam evaporation, a parallel plate radio frequency (rf) sputtering, a direct current (dc) sputtering, a radio frequency (rf) magnetron sputtering, and a direct current (dc) magnetron sputtering. A reactive physical vapor deposition may also occur in the form of an atomic layer absorption process.

Fabrication of thin films according to embodiments of the invention may be carried out under any number of temperature and pressure conditions. Various fabrication steps may be carried out at a temperature from about 250° C. to about 400° C. and or at pressure conditions from about 200 milli-Torr to about 500 milli-Torr.

Other techniques can be employed to provide for the deposition of the thin film complex oxide materials in a highly oxidizing environment. Exemplary techniques include, but are not limited to, embodiments involving plasma deposition, such as direct plasma deposition in conventional parallel plate reactors, triode plasma deposition, electron-cyclotron-resonance plasma deposition, laser-assisted deposition, and reactive physical vapor deposition using ozone, plasma-excited oxygen, or laser-excited oxygen.

Depending on the particular application, thin film dielectrics may be deposited onto either i) insulating substrates such as bulk fused silica and crystalline aluminum oxide (sapphire), ii) semiconductor substrates such as and not limited to Si, Ge, (Si,Ge) alloy, SiC, GaN, GaAs, GaSb, InP and other group III-V ternary and quaternary alloy substrates, iii) semiconductor substrates with thin dielectric layers, including, but not restricted to Si with (a) nitrided $SiO_2$, and (b) non-crystalline La aluminate, and (b) GaN and (Ga,Al)N and the like with $GaO_x$ or $AlO_x$, x~1.5, and iv) metallic substrates including ordinary metals such as Al and the like, transition metals and rare earths, including Ti, Ta, Mn, Fe, Co, and Ni, and lanthanide rare earth metals, including Gd, Nd and the like.

The depositions of the various dielectric layers may be performed in ultra-high-vacuum compatible multi-chamber systems equipped with conventional substrate introduction load locks, and the like, but the can also be performed in reactors that incorporate sufficient purging, and gas flow dynamics to prevent chemical contamination of films or substrates. Specific vacuum compatible deposition techniques include: i) chemical vapor deposition from organo-metallic, halide or hydride transition metal and rare earth precursor molecules in the presence of strong oxidizing agents such as oxygen atoms, ozone, or other oxide molecules that are known sources of oxygen, such as, and not limited to nitrous oxide, $N_2O$ and nitric oxide, NO, ii) plasma or photo-assisted chemical vapor deposition using the same transition metal, rare earth and oxygen atom precursor species as for chemical vapor deposition, iii) reactive physical vapor deposition from elemental or compound sources, iv) magnetron or parallel plate reactive sputtering from elemental or compound targets in an ambient that leads to formation of oxides, v) atomic layer deposition using precursor and oxidizing cycles that leads to formation of oxides.

For example, with reference to FIG. 2, the silicon dioxide layer 220 can be deposited by remote plasma assisted oxidation at 300° C. such that the silicon dioxide layer 220 is about 0.6 nm. Optionally, a monolayer of nitrogen can be deposited at the silicon side of the silicon dioxide layer 220 using remote plasma assisted nitridation at 300° C. The hafnium dioxide interfacial layer 240 can be deposited using remote plasma-assisted chemical vapor deposition (CVD) at a thickness of between about 0.5 and 1.0 nm. The aluminum oxide layer 260 can be deposited by atomic layer deposition (ALD) and the thickness of the layer 260 can be adjusted for a targeted equivalent oxide thickness (EOT). The device 200 can be annealed in and inert environment at a temperature of about 500 to approximately 700 or 800° C. The thickness of the layers may be determined by auger electron spectroscopy (AES).

As another example, with reference to FIG. 3, the gallium oxide layer 320 can be deposited at 300° C. using plasma assisted oxidation such that the layer 320 has a thickness of about 0.8 nm. Optionally, remote plasma assisted nitridation may be performed such that one monolayer of nitrogen is deposited on the gallium nitride side of the gallium oxide layer 320. The hafnium dioxide layer 340 can be deposited at 300° C. by remote plasma-assisted CVD such that the thickness of the layer is between about 0.5 and 1.0 nm. The silicon dioxide dielectric layer 360 can be deposited using atomic layer deposition (ALD) and its thickness can be adjusted based on a targeted equivalent oxide thickness (EOT).

Dielectric layers having an interfacial dielectric layer as shown in FIGS. 1-3 may be used as dielectric material in integrated circuit devices, including very large scale integration (VLSI) devices including Insulated Gate Field Effect Transistors (IGFET), also referred to as MOSFET or CMOS devices. As an example, field effect transistors may be provided including gate insulators having an interfacial dielectric layer as shown in FIGS. 1-3.

Figure 4A:
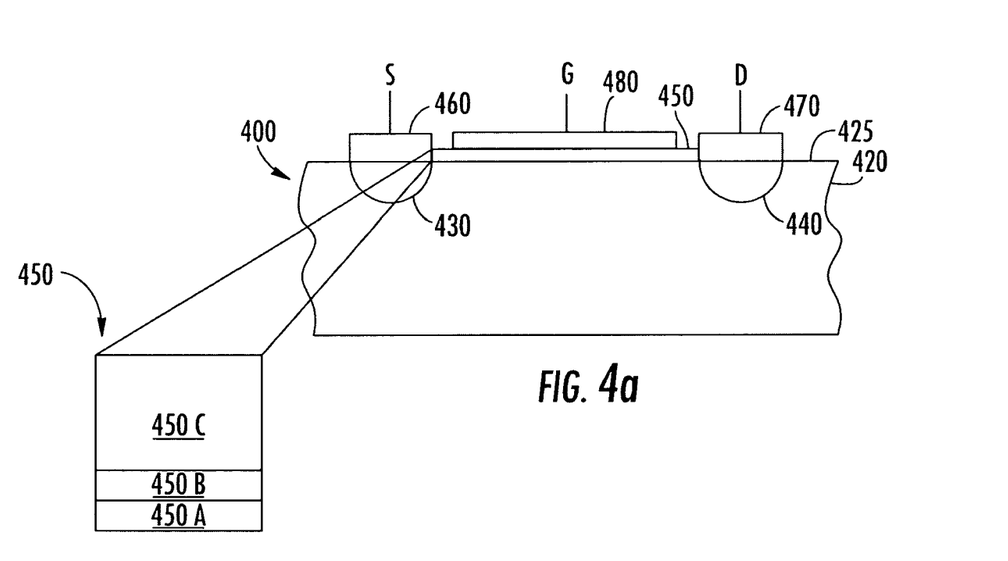
FIGS. 4a and 4b are cross sectional side views of a field effect transistor comprising a thin film oxide gate insulating layer according to embodiments of the present invention.
Figure 4B:
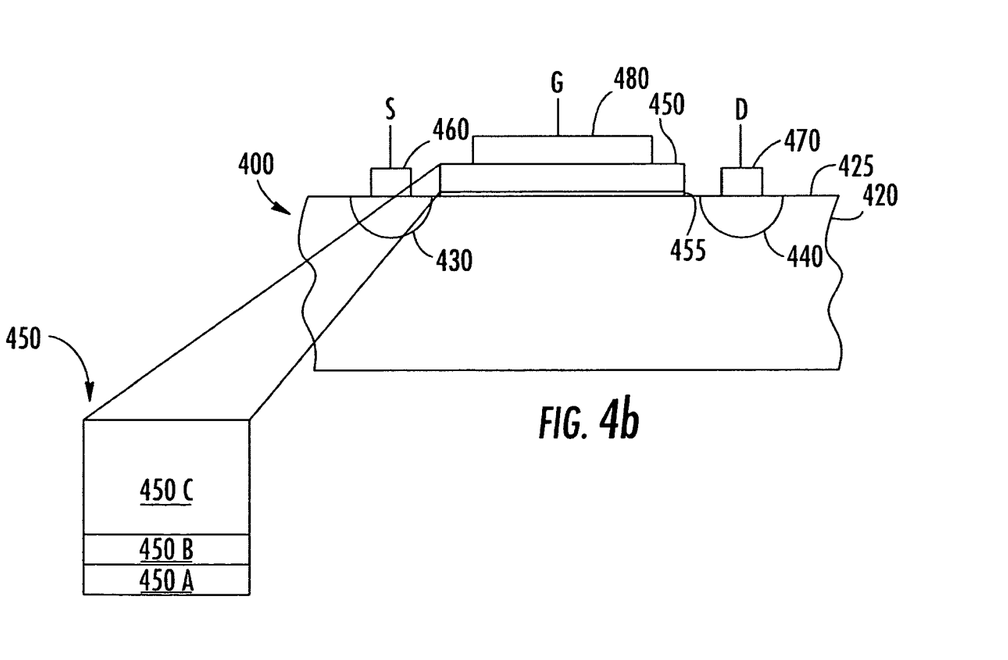

For the purposes of illustration, embodiments describing field effect transistors are set forth in FIGS. 4a and b. A field effect transistor 400 according to embodiments of the present invention is set forth in FIG. 4a. The field effect transistor 400 comprises an integrated circuit substrate 420 having a surface 425. Source and drain regions 430 and 440 respectively are present in the substrate 420 at the surface 425 in a spaced apart relationship. A gate insulating layer 450 is present on the substrate 420 at the surface 425 between the spaced apart source and drain regions, 430 and 440 respectively.

The gate insulating layer 450 includes an oxide layer 450A, an interfacial layer 450B, and a primary dielectric layer 450C. The oxide layer 450A, the interfacial layer 450B and the primary dielectric layer 450C can include the materials described with respect to the oxide layer 120, the interfacial layer 130, and the primary dielectric layer 140 of the device 100 in FIG. 1. The source, drain, and gate contacts (460, 470, and 480 respectively) are also present and contact source and drain regions 430 and 440 and the gate insulating layer 450.

A large number of materials can be employed in the integrated circuit substrate, the selection of which are known by those skilled in the art. As an example, the substrate may comprise a material selected from the group consisting of a Group III-V ternary alloy, a Group III-V quaternary alloy, a Group III-nitride alloy, and combinations thereof. Examples of Group III-V ternary alloys include, but are not limited to, (Ga,Al)As, (In,Ga)As, and combinations thereof. An example of a Group III-V quaternary alloy includes, but is not limited to, (Ga,In)(As,P). Examples of Group III-nitride alloys include, but are not limited to, (Ga,Al)N, (Ga,In)N, (Al,In)N, (Ga,Al,In)N, and combinations thereof. Quaternary alloys of the above may also be employed. Additionally, group III-V antimonides, such as GaSb, III-V ternary antimonide alloys, (Al,Ga)Sb, (In,Ga)Sb, and III-V quaternary alloys, (In,Al,Ga)Sb are also included in MOSFET device substrates containing the channel region of the device.

Other examples of materials that may be employed in the integrated circuit substrate include, but are not limited to, silicon (Si), germanium (Ge), silicon carbide (SiC), gallium nitride (GaN), gallium arsenide (GaAs), as well as other compounds from Groups III and V. Combinations thereof may also be employed.

The integrated circuit substrate may encompass a number of specific substrates that are employed in devices of this type. One example of a substrate is a semiconductor-on-insulator (SOI) substrate.

The source, drain, and gate contacts may include those that are conventionally known in the art. As an example, the gate contact may be formed from polysilicon and/or metal materials.

The field effect transistor may also include other layers of materials. For example, in some embodiments (not shown), the field effect transistor may include another interfacial layer positioned between the substrate and the gate insulating layer. The interfacial layer may include an oxide, such as an oxide including an element from the semiconductor substrate. For example, the substrate may include Si or SiC and, consequently, the interfacial layer may include silicon dioxide ($SiO_2$). Other insulating materials may be employed. Additional interfacial layers such as those comprising gallium oxide ($GaO_3$), aluminum oxide ($Al_2O_3$), or alloys thereof, may be used with compounds from Groups III and V along with their alloys. The use of the interfacial layer may be advantageous in electron-channel (n-channel) FETs and hole-channel (p-channel) FETs. The interfacial layer may contribute less than 0.5 nm of oxide-equivalent capacitance to the field effect transistor. In general, the use of an interfacial layer may be advantageous in that it may: (1) prevent or minimize further oxidation of the silicon substrate during film deposition in highly oxidizing environments, (2) prevent or minimize formation of silicide bonds during the initial stages of deposition of the non-crystalline oxide materials, particularly with respect to, for example, the formation of Ta—Si bonds during the deposition of $AlTaO_4$.

Referring now to FIG. 4b, an additional layer 455 is depicted between the gate insulating layer 450 and the integrated circuit substrate 420 in field effect transistor 410. As shown in FIG. 4b, the additional layer is approximately one layer of interfacial bonding that includes approximately one Si—N bond per silicon substrate atom.

The field effect transistor described herein may be fabricated by methods known to a person skilled in the art. For example, a gate insulating layer may be formed by depositing a non-crystalline oxide on the substrate of the field effect transistor by employing an appropriate technique including, but not limited to, those described herein. Additional interfacial layer(s) may be formed on a substrate of the field effect transistor by a suitable process such as, but not limited to, remote plasma-assisted oxidation, low pressure thermal oxidation, chemical oxidation, or photo-assisted oxidation. Thereafter, the gate insulating layer is formed by depositing the non-crystalline oxide material on the interfacial layer in the same deposition chamber used to form the interfacial layer. Alternatively, an in-line system with substrate transfer in either a high vacuum or inert environment can be used, in which chemical reactions with the interfacial layer may be minimized or prevented.

As described herein, in various embodiments, stacked dielectric layers including an interfacial layer as described in FIGS. 1-3 may be employed in field effect transistors as thin gate insulating layers having high dielectric constants.

Figure 5A:
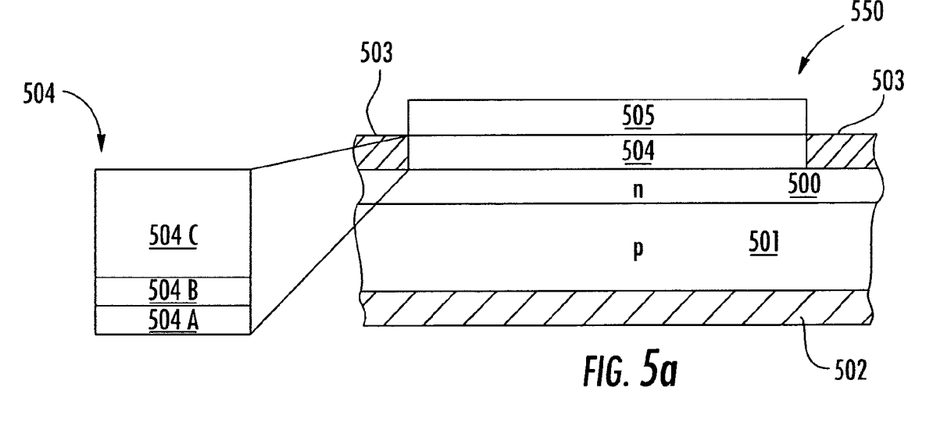
FIGS. 5a and 5b are cross sectional side views of a photovoltaic device comprising a thin film oxide passivation layer according to embodiments of the present invention.

FIG. 5a illustrates a photovoltaic device 550 having a p-type semiconductor layer ohmic contact 502, a p-type layer 501, an n-type layer 500, a dielectric film surface passivation layer 504, a second dielectric layer 505 and ohmic contacts 503. The surface passivation layer 504 includes an oxide layer 504A, an interfacial layer 504B and a primary dielectric layer 504C. The oxide layer 504A, the interfacial layer 504B and the primary dielectric layer 504C can include the materials described with respect to the oxide layer 120, the interfacial layer 130, and the primary dielectric layer 140 of the device 100 in FIG. 1.

The surface passivation layer 504 can reduce loss of photo-generated carriers in the n-type semiconductor layer 500 of the device 550. The surface passivation layer 504 and the second dielectric layer 505 can together form an anti-reflection coating. The surface passivation layer 504 may have a positive fixed charge at the interface between the n-type layer 500 and the surface passivation layer 504. This may produce a surface potential at the interface that can reduce recombination of photo-generated holes. Using the device 550 as a radiation detector under reverse bias (i.e., with a positive bias applied to the n-layer 500 through the ohmic contact 503, and the p-layer 501 maintained at ground potential through the p-type semiconductor layer ohmic contact 502) it may be necessary to have holes generated by absorption of electromagnetic radiation in the infra red, visible or near ultra-violet regions of the spectrum be transmitted into the p-layer 501 and subsequently contribute to a short circuit current in the reverse bias mode. The device 550 can also be operated an open circuit voltage or the photo-diode detector mode when the ohmic contact 503 is connected to ground through a high impedance resistive load, or a power transfer mode when the impedance of the device 550 is matched to the load resistor and no additional bias is applied. As shown in FIG. 5a, the passivation layer 504 can also serve as anti-reflection film through the incorporation of second dielectric 505, such as $Si_3N_4$ or $SiO_2$, and the like. The second dielectric 505 can be somewhat thicker than the passivation layer 504, and the thickness may be tuned to a wavelength that is within the absorption band of the semiconductor materials that comprise n-type layer 500 and p-type layer 501, as for example, Si, (Si,Ge), Ge, SiC, GaAs, (Al,Ga)As, GaN, (In,Ga)N and the like.

Figure 5B:
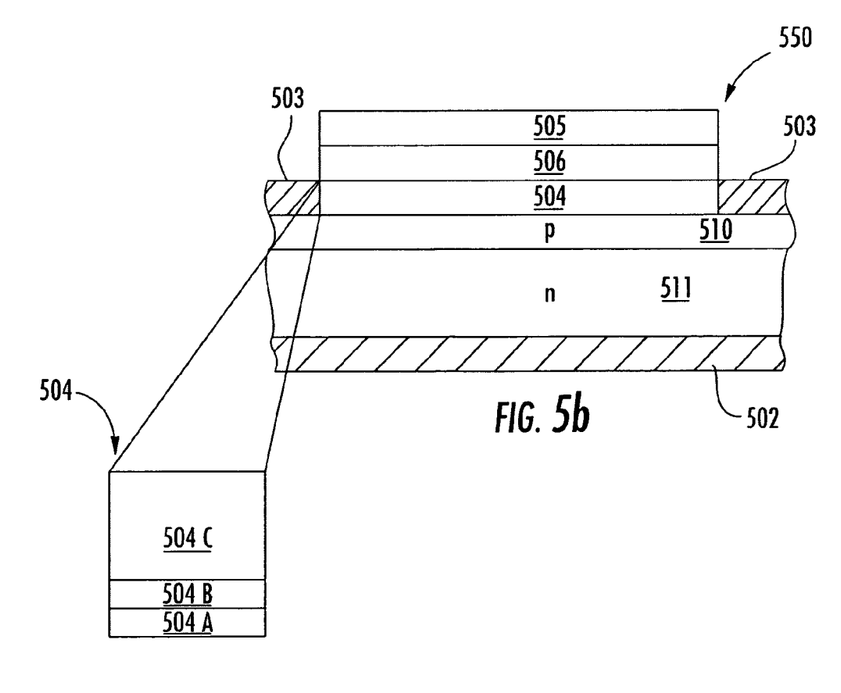

As illustrated in FIG. 5b, a third dielectric layer 506 has been added between the surface passivation layer 504 and the second dielectric layer 505, which are on p-type layer 510 and n-type layer 511. The conductivity types of layers 500 and 501 in FIG. 5a and layers 510 and 511 in FIG. 5b may be reversed so that the layers are complementary, e.g., such that one is doped n-type and the other is doped p-type.

The various dielectric layers, including the dielectric film surface passivation layer 504, the second dielectric layer 505, and/or the third dielectric layer 506, can include an oxide layer, an interfacial layer, and a primary dielectric layer such as is described with respect to the oxide layer 120, the interfacial layer 130, and the primary dielectric layer 140 of the device 100 in FIG. 1. Such dielectric materials generally have positive fixed charge. If the conductivity types are as shown in FIG. 5b (i.e., p-type semiconductor layer 510 and n-type semiconductor layer 511), then the third dielectric layer 506 may be inserted between the dielectric surface passivation layer 504 and the second dielectric layer 505. If the third dielectric layer 506 is $Al_2O_3$, and an alloy of $Al_2O_3$ with $SiO_2$, then it may have negative fixed charge at the internal interface between the dielectric surface passivation layer 504 and the third dielectric 506. This configuration may reduce electron recombination at the surface of p-type semiconductor layer 510, and can improve device performance in any one the three modes of operation described above. Moreover, the relative thicknesses of the dielectric layers including the dielectric surface passivation layer 504, the second passivation layer 505 and the third passivation layer 506 can be adjusted so that in combination they serve as anti-reflection coating with respect to a wavelength of electromagnetic radiation that is consistent with a desired functionality of the device 550. The selection of relative thicknesses can be achieved through methods known to those of skill in the art.

Figure 6A:
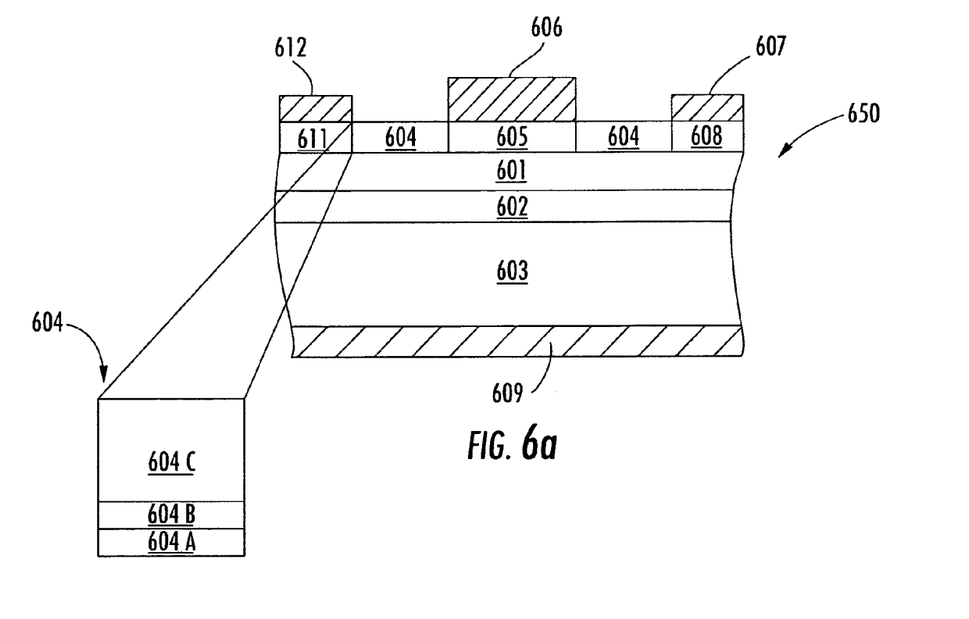
FIGS. 6a and 6b are cross sectional side views of a high electron mobility transistor comprising a thin film oxide passivation layer according to embodiments of the present invention.

A high electron mobility transistor or HEMT device 250 is shown in FIG. 6a. The HEMT device 650 includes a substrate 603. Various layers of the HEMT device 650 are formed on the substrate 603, including a curried channel semiconductor layer 602, a wide band gap semiconductor confinement layer 601, a second wide band gap semiconductor confinement layer 603, an n-type source 608, an n-type drain 611, a gate electrode 605, a source electrode 607, and a drain electrode 610. An ohmic contact 609 to the substrate 603 and an ohmic contact 606 to the gate electrode 605 are provided. A passivation layer 604 between the n-type drain 611 and the gate electrode 605 and also between the n-type source 608 and the gate electrode 605 is provided. The passivation layer 604 can include an oxide layer 604A, an interfacial layer 604B, and a primary dielectric layer 604C. The oxide layer 604A, the interfacial layer 604B and the primary dielectric layer 604C can include the materials described with respect to the oxide layer 120, the interfacial layer 130, and the primary dielectric layer 140 of the device 100 in FIG. 1.

In operation, a positive bias can be applied to the gate electrode 605, through the ohmic contact 606, and the source contact 607 can be held at ground potential through the source electrode 607, which is likewise grounded. A drain contact can be held at a positive potential through application of positive drain bias voltage to the drain electrode 610. The passivation layer 604 can suppress recombination of electrons at the respective portions of surface of the wide band gap semiconductor confinement layer 601, denoted as 601a and 601b, between the source 608 and the drain 611, and the gate electrode 605.

The semiconductor substrate 603, the wide band gap semiconductor confinement layer 601, the buried channel semiconductor layer 602, and certain other layers shown in FIG. 6a can be made of various materials, the selection of which is known to those of skill in the art. For example, the substrate 603 and wide band gap semiconductor confinement layer 601 may be doped n-type Si, and the buried channel semiconductor layer 602 can be an undoped Si,Ge alloy layer. Moreover, the source contact 608 and the drain contact 611 may be heavily doped, e.g., $>10^{19}$ cm$^{-3}$ n-type Si, for instance.

Alternatively, the semiconductor substrate 603 and wide band gap semiconductor confinement layer 601 may be doped n-type (In,Ga)As or other group III-V alloy semiconductors that can lattice-matched to an InP substrate, and the buried channel semiconductor layer 602 can be an undoped (In,Ga)As alloy layer with approximately 20 percent InAs content. The source contact 608 and the drain contact 611 may be a heavily doped ($>10^{19}$ cm$^{-3}$) n-type (In,Ga)As alloy.

As another example, the semiconductor substrate 603 in contact with the buried channel semiconductor layer 602 and the wide band gap semiconductor confinement layer 601 may comprise a doped n-type (In,Ga)As alloy or other alloy semiconductors that are lattice matched to an InP substrate. The curried channel semiconductor layer 602 can be an undoped (In,Ga)As alloy layer with approximately 20 percent InAs content. The source contact 608 and the drain contact 611 can be heavily doped ($>10^{19}$ cm$^{-3}$) n-type (In,Ga)As. The substrate 603 may also included an additional semiconductor layer (not shown), such as heavily doped InP that may be in contact with both the doped (In,Ga)As portion of 603, and the substrate layer ohmic contact 609.

In still another example, the semiconductor substrate 603 and the wide band gap semiconductor confinement layer 601 can be a doped n-type (Al,Ga)N alloy, and the buried channel semiconductor layer 602 can be an undoped (Al,Ga)N alloy or GaN. The source contact 608 and the drain contacts 611 can be heavily doped ($>10^{19}$ cm$^{-3}$) n-type (Al,Ga)N, for instance. The substrate 603 may be a composite layer in which a portion of the substrate 603 adjacent the buried channel semiconductor layer 602 is doped n-type (Al,Ga)N, and a portion of the substrate layer 603 adjacent the substrate ohmic contact 609 is a single or composite semiconductor layer such as GaN or SiC, or a combination thereof. Alternatively, the portion of the substrate layer adjacent the substrate ohmic contact 609 may include an insulating substrate such as single crystal sapphire, e.g., $Al_2O_3$, or the like.

Figure 6B:
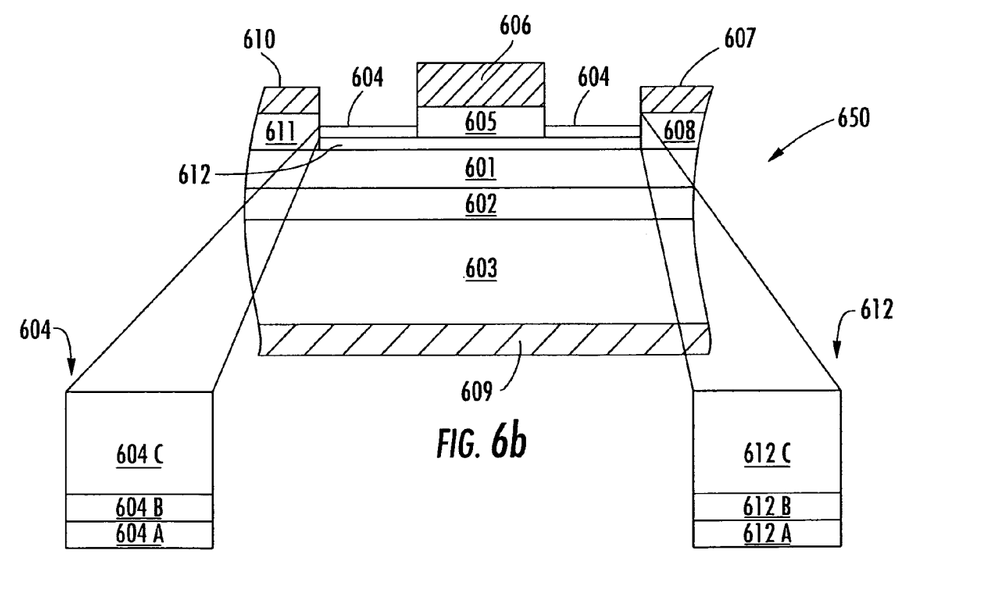

Referring to FIG. 6b, the device 650 further includes a second dielectric layer 612 that is placed between the passivation layer 604 and the gate electrode 605 and a portion of the side band gap semiconductor confinement layer 601. The second dielectric layer 612 can include an oxide layer 612A, an interfacial layer 612B, and a primary dielectric layer 612C. The oxide layer 612A, the interfacial layer 612B and the primary dielectric layer 612C can include the materials described with respect to the oxide layer 120, the interfacial layer 130, and the primary dielectric layer 140 of the device 100 in FIG. 1.

HEMT devices according to embodiments of the present invention may include addition semiconductor layers for improved operation, and/or as may be required for epitaxial growth of the channel structures. The integration of and functionality of these passivation layers may be used in devices described with respect to the examples discussed herein. Additional passivation layers may be fabricated from other generic families of III-V semiconductors including antimonides such as GaSb, III-V ternary antimonide alloys, (Al,Ga)Sb, (In,Ga)Sb, and III-V quaternary alloys, (In,Al,Ga)Sb, and the like.

As discussed above, the stacked dielectric layers having an interfacial layer described with respect to FIGS. 1-3, may have applications that include gate dielectrics and passivation layers for electronic and photonic devices as described herein. Oxide films may be provided that are generally thinner than approximately 15 nm. The thickness of a film can be determined from cross section transmission electron micrographs or by spectroscopic techniques such as thin film interference, and spectroscopic or single wave length ellipsometry. Other methods may also be applied. The dielectric layers including interfacial layers may be provided that can be either non-crystalline (as determined by conventional x-ray or electron diffraction methods, including bright field-dark field imaging, or alternatively nano- or micro-crystalline according to conventional diffraction methods indicated above, but also including other methods such as extend x-ray absorption fine structure spectroscopy, or EXAFS).

In the drawings and specification, there have been disclosed embodiments of the invention and, although specific That which is claimed:

1. A method of forming a semiconductor device, the method comprising sequential steps of:
   providing a semiconductor substrate comprising silicon;
   forming a gate insulating layer including:
   forming an oxide layer directly on the substrate, the oxide layer comprising silicon;
   forming an interfacial dielectric layer directly on the oxide layer opposite the substrate, the interfacial dielectric layer comprising HfO2, ZrO2, a zirconium silicate alloy, and/or a hafnium silicate alloy and having a thickness of between about 0.5 nm and 1.0 nm; and
   forming a primary dielectric layer directly on the interfacial dielectric layer opposite the substrate, the primary dielectric layer comprising Al03; TiO2; a group IIIB or VB transition metal oxide; a trivalent lanthanide series rare earth oxide; a silicate alloy; an aluminate alloy; a complex binary oxide having two transition metal oxides and/or a complex binary oxide having a transition metal oxide and a lanthanide rare earth oxide, and wherein a thickness of the primary dielectric layer is at least about five times greater than the thickness of the interfacial dielectric layer;
   wherein the device comprises a field effect transistor, the method further comprising forming a gate layer directly on the primary dielectric layer.

2. The method of claim 1, further comprising depositing the interfacial dielectric layer and/or the primary dielectric layer by remote plasma assisted deposition.

3. The method of claim 1, further comprising depositing the interfacial dielectric layer and/or the primary dielectric layer by atomic layer deposition.

4. The method of claim 1, wherein the interfacial dielectric layer has an equivalent oxide thickness (EOT) of less than about 0.20 nm.

5. The method of claim 1, wherein the primary dielectric layer has an equivalent oxide thickness (EOT) of greater than about 1.0 nm.

6. The method of claim 1, wherein the oxide layer further comprises nitrogen.

7. The method of claim 1, wherein the oxide layer has a thickness of less than about 0.80 nm.

8. The method of claim 1, wherein the substrate comprises silicon carbide.

9. A method of forming a semiconductor device, the method comprising sequential steps of:
   providing a semiconductor substrate comprising a group III-IV or group III-V compound;
   forming a gate insulating layer including:
   forming an oxide layer directly on the substrate, the oxide layer comprising a group III element from the substrate;
   forming a interrracial dielectric layer directly on the oxide layer opposite the substrate comprising HfO2, ZrO2, a zirconium silicate alloy, and/or a hafnium silicate alloy and having a thickness of between about 0.5 nm and 1.0 nm;
   forming a primary dielectric layer directly on the interfacial dielectric layer opposite the substrate, wherein the primary dielectric layer comprises silicon or a silicon oxynitride alloy and wherein a thickness of the primary dielectric layer is at least about five times greater than the thickness of the interfacial dielectric layer;
   wherein the device comprises a field effect transistor, the method further comprising forming a gate layer directly on the primary dielectric layer.

10. The method of claim 9, further comprising depositing the interfacial dielectric layer and/or the primary dielectric layer by remote plasma assisted deposition.

11. The method of claim 9, further comprising depositing the interfacial dielectric layer and/or the primary dielectric layer by atomic layer deposition.

12. The method of claim 9, wherein the interfacial dielectric layer has an equivalent oxide thickness (EOT) of less than about 0.20 nm.

13. The method of claim 9, wherein the primary dielectric layer has an equivalent oxide thickness (EOT) of greater than about 1.0 nm.

14. The method of claim 9, wherein the oxide layer further comprises nitrogen.

15. The method of claim 9, wherein the oxide layer has a thickness of less than about 0.80 nm.

16. The method of claim 9, wherein the substrate comprises gallium nitride or gallium arsenide.

17. The method of claim 9, wherein the oxide layer is directly on the substrate.

* * * * *

UNITED STATES PATENT AND TRADEMARK OFFICE
CERTIFICATE OF CORRECTION

PATENT NO. : 7,507,629 B2 Page 1 of 1
APPLICATION NO. : 10/938110
DATED : March 24, 2009
INVENTOR(S) : Lucovsky et al.

It is certified that error appears in the above-identified patent and that said Letters Patent is hereby corrected as shown below:

<u>In the Claims,</u>
Column 15, Claim 1, Line 13: correct "HfO2, ZrO2," to read -- $HfO_2$, $ZrO_2$, --

Column 15, Claim 1, Line 18: correct "A103; TiO2;" to read -- $AlO_3$; $TiO_2$; --

Column 16, Claim 9, Line 10: "interracial" to read -- interfacial --

Column 16, Claim 9, Line 11: correct "HfO2, ZrO2," to read -- $HfO_2$, $ZrO_2$, --

Signed and Sealed this

Fourteenth Day of July, 2009

JOHN DOLL
*Acting Director of the United States Patent and Trademark Office*